(12) United States Patent
Sorensen

(10) Patent No.: US 7,495,584 B1
(45) Date of Patent: Feb. 24, 2009

(54) WIRELESS STEERING COLUMN SWITCH LEVERS

(76) Inventor: Fred Sorensen, 2488 Cass Rd., Traverse City, MI (US) 49684

( * ) Notice: Subject to any disclaimer, the term of this patent is extended or adjusted under 35 U.S.C. 154(b) by 114 days.

(21) Appl. No.: 11/306,316

(22) Filed: Dec. 22, 2005

(51) Int. Cl.
*H03M 11/00* (2006.01)

(52) U.S. Cl. .............................. 341/20; 341/176; 701/36; 701/45; 701/51; 340/825.72; 340/479; 340/467; 340/456; 340/453

(58) Field of Classification Search .................. 341/20, 341/22, 176; 340/870.72, 870.69, 467, 479, 340/453, 456; 701/36, 45, 51
See application file for complete search history.

(56) References Cited

U.S. PATENT DOCUMENTS

| | | | | |
|---|---|---|---|---|
| 5,442,332 A | * | 8/1995 | Hughes | 340/467 |
| 5,666,103 A | * | 9/1997 | Davis, Jr. | 340/479 |
| 6,909,379 B2 | * | 6/2005 | Niizato | 340/825.72 |
| 6,933,839 B2 | * | 8/2005 | Henry | 340/479 |
| 6,970,074 B2 | * | 11/2005 | Perlman | 340/426.1 |
| 6,982,633 B2 | * | 1/2006 | Burdick | 340/432 |
| 7,026,919 B2 | * | 4/2006 | Perlman et al. | 340/426.18 |
| 7,199,705 B1 | * | 4/2007 | Mixon | 340/479 |
| 2004/0207520 A1 | * | 10/2004 | Chuang | 340/475 |
| 2006/0012471 A1 | * | 1/2006 | Ross et al. | 340/479 |

\* cited by examiner

*Primary Examiner*—Albert K Wong
(74) *Attorney, Agent, or Firm*—Northern Michigan Patent Law, PLC

(57) ABSTRACT

A switch-equipped lever of the type mounted on a vehicle steering column and having an end knob with a switch mechanism for controlling a remote vehicle system, in which the knob is provided with a wireless signal transmitter, the wireless transmitter controlled by the switch mechanism in the knob to control the remote vehicle system with a wireless signal.

8 Claims, 5 Drawing Sheets

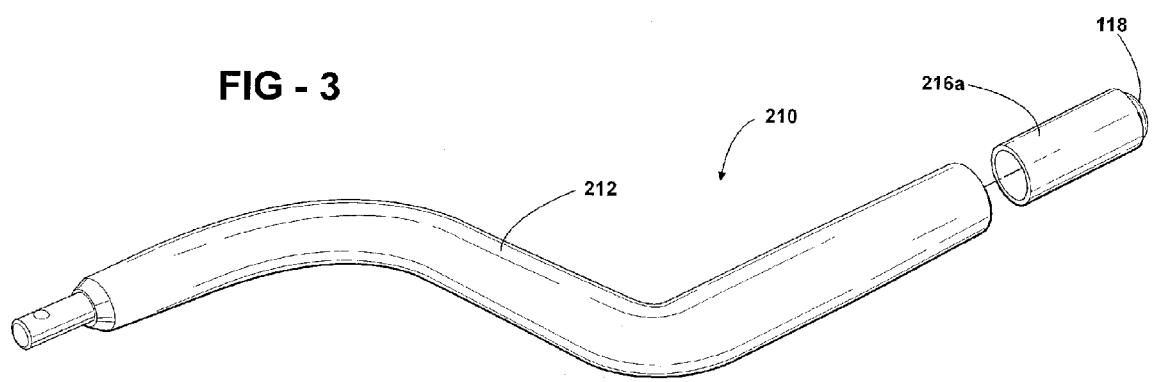
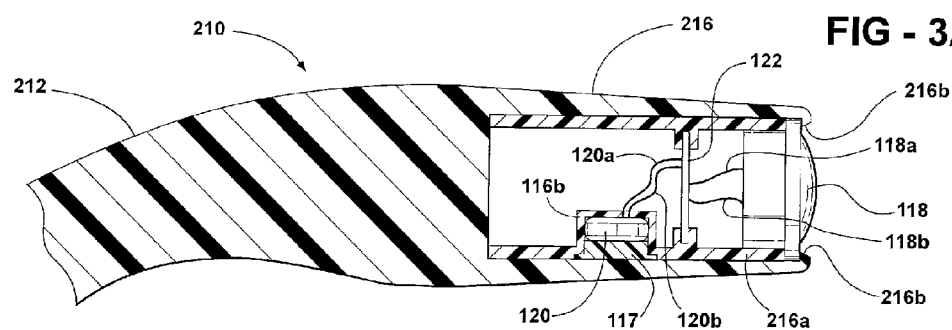

WIRELESS STEERING COLUMN SWITCH LEVERS

FIELD OF THE INVENTION

The present invention is in the field of automotive steering column levers equipped with switches for controlling remote vehicle systems.

BACKGROUND AND DESCRIPTION OF RELATED ART

Steering column-mounted levers for automotive vehicles are often provided with switches for controlling remote vehicle systems such as high-beam headlights, trailer lights, overdrive functions, wipers, and cruise controls, to name a few. The switches must be wired through the levers, with varying degrees of difficulty.

Steering column-mounted gear shift levers, for example, are particularly difficult to wire. They are typically fashioned with an ergonomic curved or bent shape, having one or more sharp bends between the operator knob end and the inner end connected to the steering column. Shift levers often have a switch in the operator knob, for example a pushbutton switch or a rotatable switch, for operating remote vehicle systems like those listed above. Electrical wiring from the switch runs through a hollow bore formed in the shift lever for this purpose.

The shift lever is subject to significant stress during shifting operations, and must be strongly built. The typical switch-equipped shift lever uses a relatively thick-walled steel tube as its core, with the bore open at the knob end and plugged or blind-bored at the column end to provide structural support for a mechanical connection to the steering column. The tubular steel core is formed into the bent shape of the lever, and then covered with a decorative and user-friendly plastic material by over-molding a plastic sheath onto the steel. An angled wire passage is drilled or otherwise formed through the wall of the steel tube at or near the closed column end, such that the wiring from the knob-mounted switch can run through the shift lever bore and exit near the column end at an angle to the shift lever axis.

The typical shift lever, although strong, is accordingly difficult and expensive to manufacture. The steel tube is often formed, for example, by gun-drilling a bore in a solid steel billet. The shape-forming process requires powerful machinery. Molding a plastic cover onto the formed steel core requires more machinery and manufacturing steps, and delays the wiring assembly until the heat from the over-molding process has dissipated. Finally, fishing the electrical wires from the knob assembly through the sharp bends of the shift lever bore and out the small, angled wire outlet at the closed steering column end is labor-intensive.

To address the foregoing problems, my co-pending U.S. application Ser. No. 11/160,793 discloses a switch-equipped shift lever with a solid core and a pre-molded plastic cover or sheath formed in two or more clamshell-type sections radially mated over the core, and with an open wiring raceway exposed on the interior of at least one of the sheath sections. The switch wiring can accordingly be mounted on the interior of the clamshell section as, or before, the sheath sections are secured to the shift lever core.

Other types of switch-equipped levers can be found mounted on steering columns, for example turn signal lever arms that include switch knobs for purposes such as switching between high and low headlight beams, or operating front or rear wipers. These other switch-equipped levers tend not to require the strength of a shift lever, and may be easier to wire as a result of having shorter, straighter, hollow shafts without reinforcing structural cores. Wiring the switches on such levers is nevertheless a relatively time-consuming task, and still requires providing a wire pathway through the lever arm or shaft.

BRIEF SUMMARY OF THE INVENTION

The present invention is a steering column-mounted lever with an end-mounted wireless transmitter for controlling a remote vehicle system normally controlled by a wire-carried signal from a lever-mounted switch. The transmitter is located in the switch knob assembly on the outer end of the lever. The switch mechanism is preferably operated in conventional mechanical fashion, for example with a pushbutton or rotary or slide mechanism, but the switch operates the transmitter in the knob to supply a wireless control signal to the remote vehicle system.

The shift lever accordingly does not need to be designed around the typical switch wiring, so hollow cores, wiring raceways, and the like are eliminated, allowing for a simple solid arm or core (and simplified cover or sheath, depending on the type of lever). The switch-equipped lever may even be formed in one piece, without the need for separate core and sheath structures.

In a preferred form the transmitter's power source is a battery in the switch knob, and the battery is preferably replaceable, for example via an access cover located unobtrusively on the knob in a location not readily visible to the vehicle's driver.

These and other features and advantages of the invention will become apparent upon further reading of the specification and accompanying drawings.

BRIEF DESCRIPTION OF THE DRAWINGS

FIG. 3 is an exploded view of an alternate construction for a shift lever and switch knob according to the invention.

FIG. 3A is a side elevation view, partially sectioned, of the switch knob end of the shift lever of FIG. 3.

DETAILED DESCRIPTION OF THE INVENTION

Figure 1:
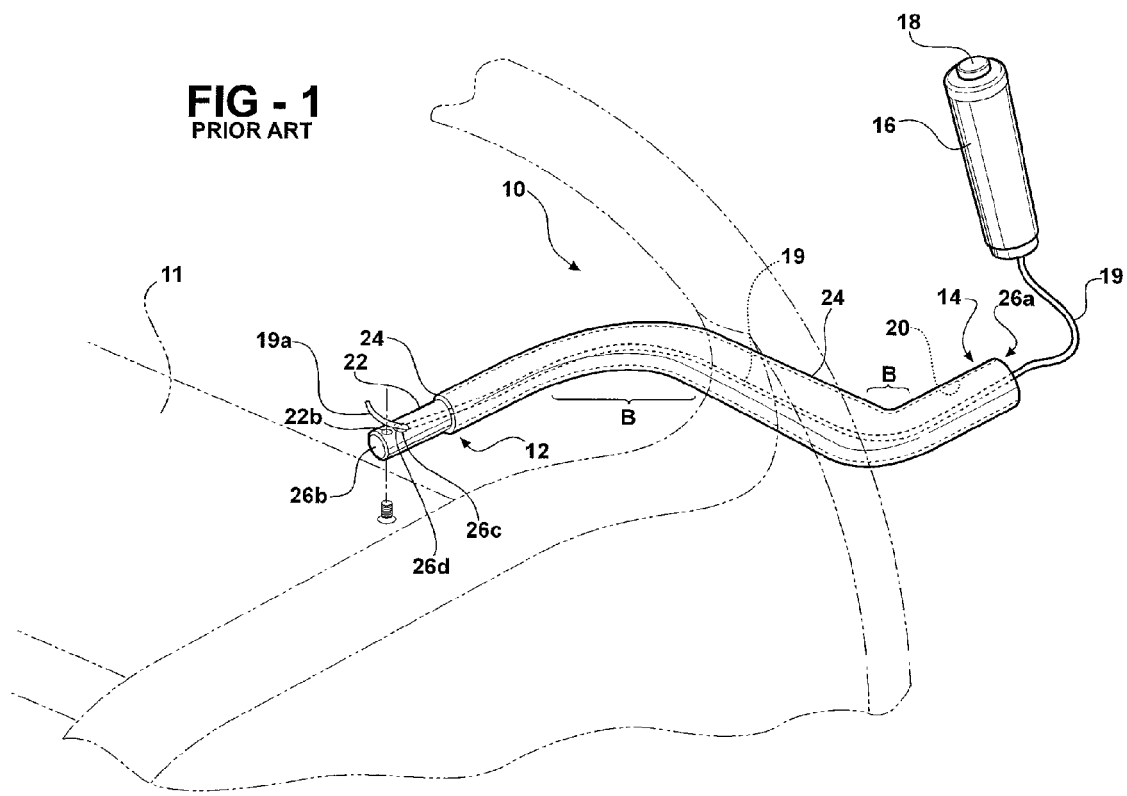
FIG. 1 is an exploded perspective view of a prior art shift lever and switch knob with a conventional hollow steel core and wiring raceway.

FIG. 1 shows a typical prior art shift lever 10, adapted to be secured at its inner end 12 to a steering column 11, and with a free outer end 14 having a handle or knob 16 with a built-in switch 18 of known type. In the illustrated embodiment the switch is a pushbutton type mounted on the end of knob 16 to operate trailer lights or a transmission overdrive. Those skilled in the art will recognize that the invention is not limited to use with this particular type of shift lever switch for these functions, but lends itself to other types of switches incorporated into the end of a shift lever to control various vehicle functions, for example rotary switches.

Switch assembly 18 has one or more electrical or signal wires or wire bundles 19 intended to be connected at terminal end(s) 19a with appropriate terminals in the steering column. First, however, wiring 19 must be routed through shift lever 10.

Shift lever 10 has a tubular steel core 20 with an exposed steering-column connecting portion 22 at inner end 12, the remainder of core 20 being covered with a decorative and cushioning or insulating plastic 24, usually applied with a known over-molding type process. Core 20 is usually tapered, narrowing toward the steering column end. Knob 16 can be a separate piece with a pre-assembled switch 18, mechanically attached to the tubular steel core, or it can be an integral extension of the tubular steel core with switch 18 added as a subassembly. The steering column end of casing 24 often has a molded plastic collar or flange (not shown) to provide an attractive and sealing interface with a mating opening in the steering column, while steel connecting portion 22 is hidden inside the steering column housing. Connecting portion 22 is typically shaped and/or provided with a fastener such as a bolt or set screw 22a extending through a tapped hole 22b to secure it solidly to a gear-shifting control link in the steering column.

Still referring to FIG. 1, core 20 is hollow, with a bore 26 running the length of the shift lever from an opening 26a at the outer end. Bore 26 is open at 26a at the outer end of the shift lever, and closed or plugged at inner end 26b. Switch wiring 19 is accordingly routed axially through bore 26 from opening 26a through the shift lever to a radial wire exit opening 26c, beveled or angled at 26d to help guide the terminal end of the wiring out of the shift lever core at an acute angle. For shift levers with the typical one or two sharp bends B between the outer and inner ends, this wire-feeding step can be difficult. Moreover, the wire-feeding step is often delayed by the over-molding process, which takes time to cool before the shift lever can be handled.

Figure 2:
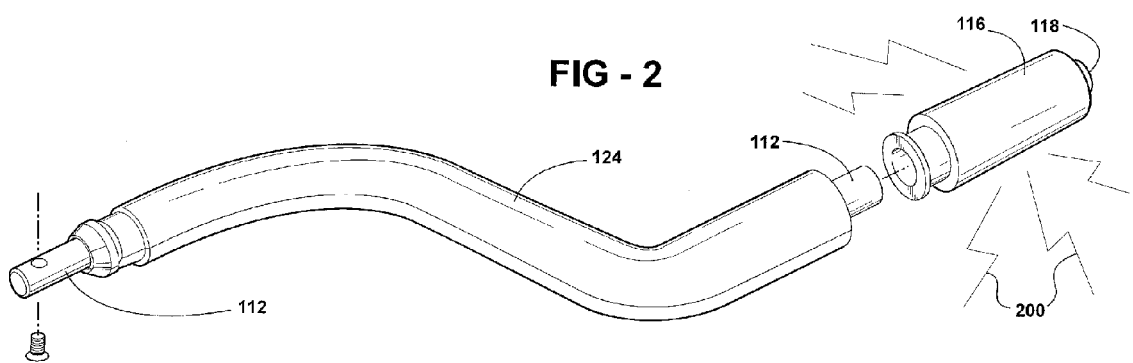
FIG. 2 is an exploded perspective view of a shift lever construction with a wireless switch knob according to the present invention.
Figure 2A:
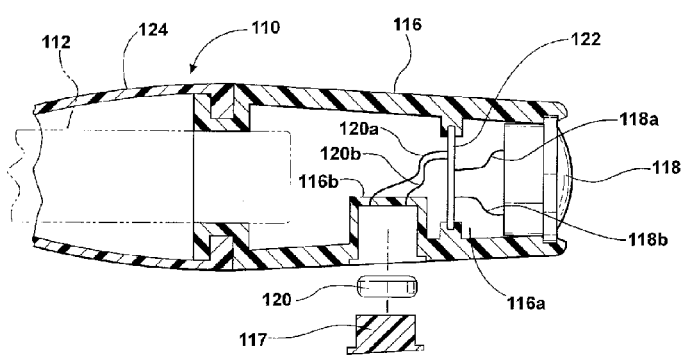
FIG. 2A is a side elevation view, partially sectioned, showing the switch knob end of the shift lever of FIG. 2.

Referring to FIGS. 2 and 2A, a shift lever 110 according to the present invention is illustrated in an exploded condition in which a solid structural core 112 capable of transferring and withstanding shifting forces is covered by a decorative or insulating plastic sheath or casing 124. Alternately, shift lever body 110 may be a monolithic piece of material without a separate casing. In either case, no provision for wiring, either in the structural core 112 or in any cover or casing 124, is necessary.

Knob 116 can be conventional in its outer appearance and shape and manner of attachment to the end of shift lever 110, and therefore will typically and preferably be enlarged in diameter or width or otherwise distinguished from the body of shift lever 110, both for gripping during shifting, and so that the driver can readily find and operate the switch mechanism without taking his eyes off the road. It will also be understood that although the illustrated example shows a switch mounted on the end of a gear shift lever with a strong structural core that makes wiring particularly difficult, the wireless switch mechanism can also be mounted on other types of steering column-mounted levers.

While solid core 112 is preferably of smaller diameter than prior hollow cores, and of constant diameter rather than tapered like prior cores, significantly reducing weight and/or manufacturing expense, core 112 could be of larger diameter and/or tapered if desired.

While core 112 is preferably made from steel, its solid cross-section lends itself more readily to alternate materials, including but not limited to metals other than steel, thermoplastic polymers, thermosetting polymers, and fiber-reinforced composite materials.

Still referring to FIGS. 2 and 2A, knob 116 can be formed separately and then attached securely to the outer end 114 of shift lever 110 in conventional fashion, as shown. Alternately, knob 116 can be manufactured as an integral part of shift lever 110, for example in a plastic molding or metal machining process. However attached or formed on the end of shift lever 110, knob 116 is provided with a switch mechanism 118, in the illustrated embodiment a conventional pushbutton type on/off switch on the end of the knob.

It will also be understood that while knob 116 is shown as enlarged relative to the end of shift lever 110, it need not be, depending on the dimensions of the shift lever and the desired feel or appearance. By "knob" is meant the switch-containing end portion attached to or formed on the outer end of shift lever 110, usually as a distinct piece or section.

The interior of knob 116 contains a suitable wireless signal transmitter 122, either mounted in a hollow in the knob or molded into an interior portion of the knob using known molding techniques, and a self-contained power source such as a long-life battery. It will be understood that although a battery such as a coin- or button-type lithium battery is currently preferred, other power sources capable of being activated by the switch mechanism 118 to power the wireless transmitter in knob 116 are possible. For example, small devices capable of being mounted in knob 116 and generating electricity from mechanical motion or pressure, such as those used in piezo type switches, those used in implantable RFID chips and tags, and others known to those skilled in the art, might be suitable for use with certain transmitter devices for the limited ranges to systems elsewhere on the vehicle.

FIG. 2A shows knob 116 in section, with a pushbutton switch mechanism 118 mounted in a compartment 116a opening onto the end of the knob. Switch 118 operates in known fashion to make an electrical connection between battery 120 contained in compartment 116b and a wireless signal transmitter 122 secured inside the knob, for example via electrical leads 118a, 118b and 120a, 120b. Transmitter 122 can be any known type of wireless signal transmitter capable of being powered by a power source such as battery 120 contained in the knob, and capable of controlling a remote vehicle system remote from the shift lever with the resulting wireless signal. This can include simple on/off functions, as well as more complex operations such as stepwise or continuous adjustments to the remote vehicle system's operation.

While radio frequency signals are common, other types of wireless signal such as infrared may be possible, as will be understood by those skilled in the art. Suitable small transmitters include the type used in remote keyless entry or "RKE" fobs attached to keychains and used to lock, unlock, open and close vehicle doors, to turn vehicle alarms on and off, and to flash vehicle lights as a visible check of locked status. This type of wireless transmitter is widely available in chip or miniature PC board form (for example having a battery-operated, switch-responsive microcontroller coupled to an RF transmitter and printed-circuit loop antenna, as described in Dallas Semiconductor publication "Requirements of Remote Keyless Entry (RKE) Systems" dated Nov. 11, 2004, Application Note 3395); is compact enough to be fitted into a gear shift knob 116; can have a battery life measured in years; and has more than enough range and power to operate onboard vehicle systems from the shift lever.

The wireless signal 200 emitted from the shift lever should not interfere with the operation of other vehicle systems, or with the operation of similarly-equipped vehicles nearby. Protocols and regulations for doing so are believed to be well-known in the art, resulting in signal transmitters (such as the RKE type) with frequencies and codes designed not to interfere with one another or with the function of vehicle systems.

Battery compartment 116b in the illustrated embodiment is located on a lower side of knob 116, where for appearance it is not readily visible to the driver. Compartment 116b preferably has a removable cover 117 to keep the battery 120 securely in the compartment, and to hide the battery. Cover 117 can be made to be easily removed by a vehicle owner for replacement of battery 120, or can be made tamper-resistant such that only a qualified repairman is able to access the battery.

Referring next to FIGS. 3 and 3A, a shift lever 210 with an alternate implementation of the invention has a solid, one-piece structural arm or body 212 formed of a suitable metal or polymer or composite material, with an integrally formed switch knob portion 216 formed as a seamless hollow extension of arm 212 on the outer end of the shift lever. A switch assembly in a tubular housing 216a is inserted into the open end of knob portion 216, mechanically held in place by shoulder 216b formed around the open end. The switch assembly in housing 216a includes the same switch mechanism 118, battery 120, and wireless transmitter 122 as in FIGS. 2 and 2A above, and operates in identical fashion.

While the foregoing examples show a separate knob portion 116 (FIG. 2) and a separate switch assembly 216 (FIG. 3), it will be understood that other structures and methods of incorporating the wireless transmitter, switch, and battery in the switch knob portion of the shift lever may be possible.

Figure 4:
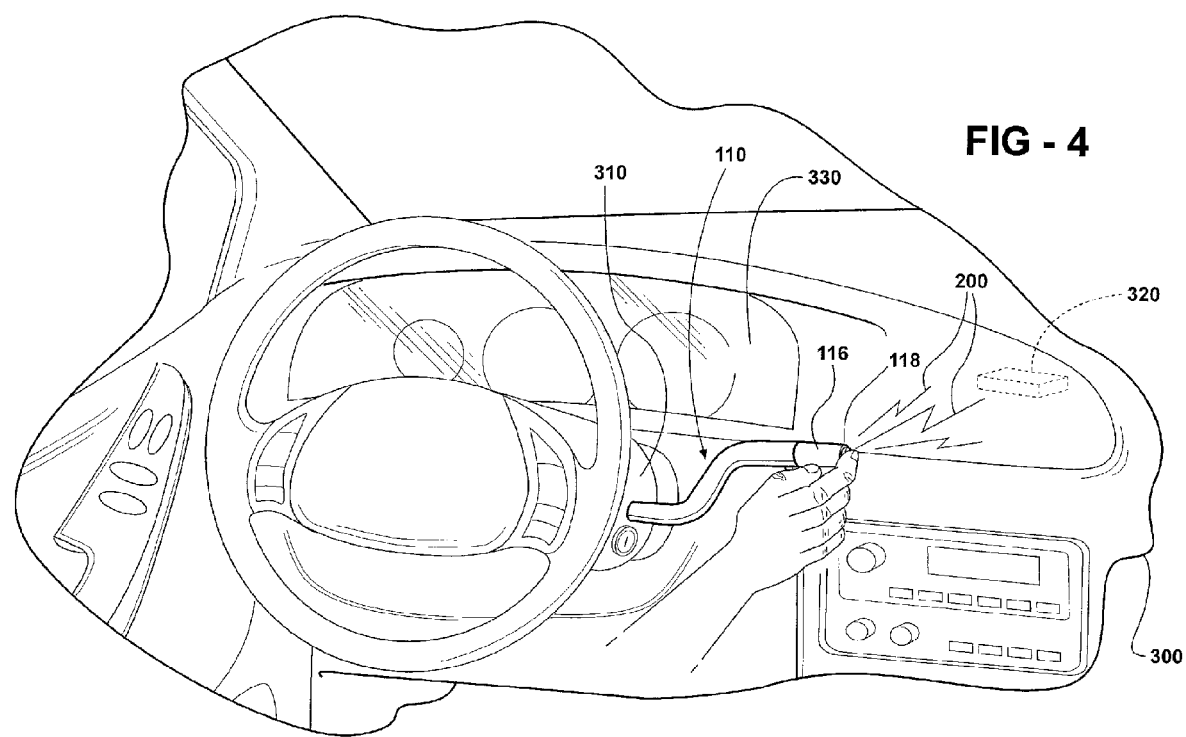
FIG. 4 is a perspective driver's-eye view of a shift lever according to the invention, with the switch being operated to control a schematically illustrated remote system on the vehicle by wireless signal.

FIG. 4 shows the shift lever 110 of FIG. 2 installed on a steering column 310 in a vehicle 300 in conventional fashion, operable to shift gears in the transmission. A remote vehicle system 320 operated by the transmitter in shift lever switch knob 116 is illustrated schematically as a wireless signal receiver in the instrument panel 330. It will be understood that the location of the remote vehicle system operated by switch knob 116 can be anywhere on or in the vehicle, and that a suitable wireless receiver connected to the remote vehicle system can be located with, or built into, the remote vehicle system, or the receiver can be placed at an optimal location to receive the wireless signal from the shift lever and then transmit that signal to a remote vehicle system at a different location in the vehicle by conventional wiring. Just as suitable transmitters such as the RKE type are known and available and readily adapted for use in the shift lever, RKE type radio frequency receivers and microcontrollers are known and capable of responding to a wireless signal from the shift lever to control a remote vehicle system.

While the illustrated examples show a single switch mechanism for generating a signal to operate a single remote vehicle system from the shift lever, it will be understood that the invention allows for multiple switches or buttons on the shift lever for operating multiple remote vehicle systems by wireless signal. For example, RKE keychain fobs are commonly provided with several buttons to control different vehicle functions.

Figure 5:
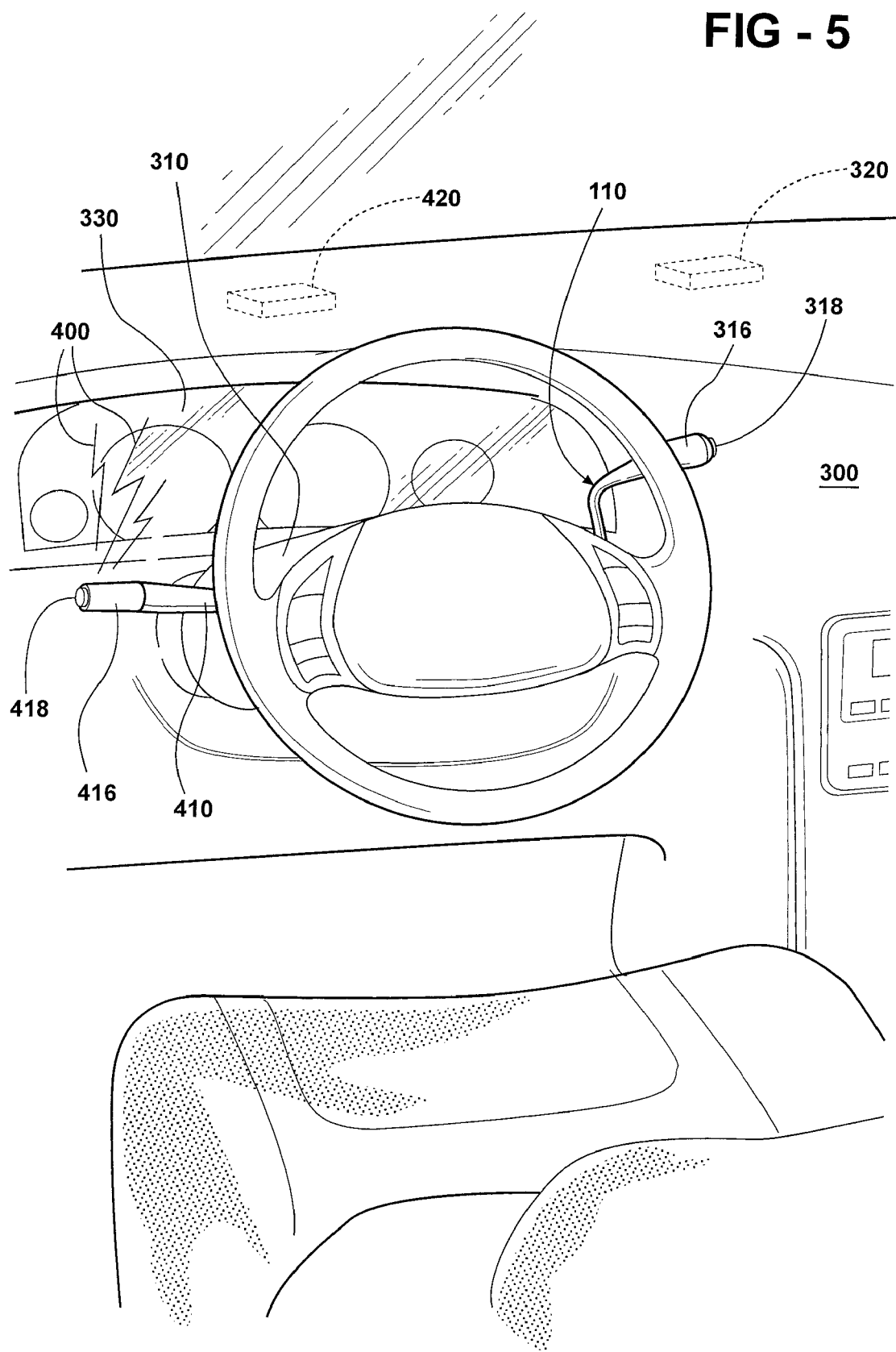
FIG. 5 is similar to FIG. 4, but shows a turn signal lever on the other side of the steering column provided with a wireless switch knob according to the present invention.

Referring next to FIG. 5, the other side of steering column 310 is shown with a turn signal lever 410 with a switch knob 416 and a pushbutton type switch 418. Switch knob 416 and pushbutton 418 have a conventional-looking outer form and functional feel, but the switch mechanism inside switch knob 416 and activated by switch 418 is a wireless switch mechanism like that described above in FIGS. 2-4 in the switch knobs 116 and 216 on the gear shift lever 110 and 210. Operation of switch 418 accordingly transmits a wireless control signal 400 to a complementary wireless receiver connected to a remote vehicle system, illustrated schematically at 420 in FIG. 4. It will be understood that the shape of switch knob 416 and the mechanical operation of switch 418 (rotary, pushbutton, sliding, etc.) can vary just as conventional wire-connected switch mechanisms in turn signal levers vary. It will further be understood that while a turn signal lever has been used as an example of another type of steering column-mounted lever to which the wireless switch mechanism of the invention can be applied, other types of switch-mounting lever controls on the steering column can be modified with the wireless switch mechanism.

It will be understood that the disclosed embodiments are representative of presently preferred forms of the invention, but are intended to be illustrative rather than definitive of the invention. The scope of the invention is defined by the following claims.

I accordingly claim:

1. In a steering-column mounted lever comprising the existing combination of a lever arm operable to control a first vehicle system and a knob portion defining an outer end of the lever arm, the knob portion comprising an existing switch mechanism that is independently operable of the lever arm and dedicated to control a second vehicle system different and independent from the first vehicle system operated by the lever arm, the knob portion switch mechanism normally being wired through the lever arm to control the second vehicle system, the improvement comprising a wireless control connection from the existing switch mechanism in the knob portion to control the second vehicle system by wireless signal transmitted from the knob portion in response to the existing switch mechanism.

2. The lever of claim 1, wherein the knob portion is a separately formed portion attached to the end of the lever arm.

3. The lever of claim 1, wherein the knob portion is an integrally formed part of the lever arm.

4. The lever of claim 1, wherein the lever is a gear shift lever.

5. The lever of claim 1, wherein the lever is a turn signal lever.

6. The lever of claim 1, wherein the lever arm has a solid core.

7. A method for operating a remote vehicle system using a switch-equipped knob portion defining an outer end of an existing lever and knob portion combination mounted on a steering column, the lever operable to control a first vehicle system, an existing switch on the knob portion being operable independently of the lever and dedicated to operate a remote second vehicle system different and independent from the first vehicle system operated by the lever, the knob portion switch mechanism normally being wired through the lever arm to control the second vehicle system, comprising the step of using the existing switch in the switch knob portion to control the remote second vehicle system with a wireless signal transmitted from the knob portion.

8. In a vehicle comprising existing first and second independent vehicle systems controlled from a steering-column mounted lever, the steering column-mounted lever comprising an existing combination of a lever arm operable to control the first vehicle system and a knob portion defining an outer end of the lever arm and including an existing switch mechanism independently operable of the lever arm and dedicated to control the second remote vehicle system, the knob portion switch mechanism normally being wired through the lever arm to control the second vehicle system, the improvement comprising a wireless control connection from the existing switch mechanism to control the second remote vehicle system by wireless signal transmitted from the knob end in response to the switch mechanism, and the second remote vehicle system including a wireless signal receiver for receiving the wireless signal from the wireless transmitter in the knob portion.

* * * * *